United States Patent
Fortin et al.

(10) Patent No.: US 6,739,497 B2
(45) Date of Patent: May 25, 2004

(54) SMT PASSIVE DEVICE NOFLOW UNDERFILL METHODOLOGY AND STRUCTURE

(75) Inventors: Clément J. Fortin, Granby (CA); Pierre M. Langevin, Granby (CA); Son K. Tran, Endwell, NY (US); Michael B. Vincent, Chenango Forks, NY (US)

(73) Assignee: International Busines Machines Corporation, Armonk, NY (US)

( * ) Notice: Subject to any disclaimer, the term of this patent is extended or adjusted under 35 U.S.C. 154(b) by 45 days.

(21) Appl. No.: 10/145,467

(22) Filed: May 13, 2002

(65) Prior Publication Data

US 2003/0209590 A1 Nov. 13, 2003

(51) Int. Cl.[7] .............................................. B23K 31/02
(52) U.S. Cl. ..................... 228/215; 228/223; 228/233.2
(58) Field of Search ........................... 228/180.22, 214, 228/223, 224, 233.2, 234.1, 215

(56) References Cited

U.S. PATENT DOCUMENTS

| | | | |
|---|---|---|---|
| 4,339,785 A | 7/1982 | Ohsawa | 361/411 |
| 5,085,364 A | 2/1992 | Ishikawa et al. | 228/139 |
| 5,128,746 A | 7/1992 | Pennisi et al. | 357/72 |
| 5,493,259 A | 2/1996 | Blalock et al. | 333/182 |
| 5,528,461 A * | 6/1996 | Gore et al. | 361/760 |
| 5,529,957 A | 6/1996 | Chan | 437/250 |
| 5,814,401 A | 9/1998 | Gamota et al. | 428/343 |
| 6,013,571 A * | 1/2000 | Morrell | 438/612 |
| 6,071,371 A | 6/2000 | Leonard et al. | 156/297 |
| 6,202,917 B1 | 3/2001 | Weaver et al. | 228/180 |
| 6,234,379 B1 * | 5/2001 | Donges | 228/207 |
| 6,458,472 B1 * | 10/2002 | Konarski et al. | 428/620 |
| 6,475,828 B1 * | 11/2002 | Hoang | 438/108 |
| 6,489,180 B1 * | 12/2002 | Tsai et al. | |
| 6,578,755 B1 * | 6/2003 | Elenius et al. | 228/254 |
| 2002/0190370 A1 * | 12/2002 | Shi et al. | |
| 2003/0049411 A1 * | 3/2003 | Chaudhuri et al. | |
| 2003/0080437 A1 * | 5/2003 | Gonzalez et al. | |

FOREIGN PATENT DOCUMENTS

JP 401100993 A 4/1989 ............ H05K/3/34

OTHER PUBLICATIONS

AMICON® E 1350 Series, "No Flow–Fluxing Underfill Encapsulants for Flip Chip Devices", Emerson & Cuming, Speciality Polymers.
SE–CURE® 9101 "Reflow Encapsulant", Kester Solder, Polymer Products Group.
STAYCHIP™, NUF–DP0071—No Flow Underfill, Developmental Product Information.
Dexter, HYSOL® FF 2200, "Reflow Encapsulant".
Dexter, HYSOL® FluxFill™ 2000, "Reflow Encapsulant".

* cited by examiner

Primary Examiner—Kiley Stoner
(74) Attorney, Agent, or Firm—John A. Jordan; Arthur J. Samodovitz

(57) ABSTRACT

An electronic fabrication process and structure is provided for attaching discrete passive surface mount devices (SMD) to a substrate in a single step. A liquid noflow resin encapsulant containing flux material is dispensed between presoldered pads on a substrate. The SMD, having a pair of electrical contacts, is pressed into said encapsulant so that the electrical contacts make contact with said presoldered pads. Heat is applied to first activate said flux material and then reflow the solder on said presoldered pads to bond said SMD contacts to said presoldered pads. The reflow temperature is maintained for about 180 seconds during which time the resin solidifies. The resin encapsulant fills the space between substrate and SMD and forms fillets around the solder bonded contacts.

17 Claims, 3 Drawing Sheets

SMT PASSIVE DEVICE NOFLOW UNDERFILL METHODOLOGY AND STRUCTURE

BACKGROUND OF THE INVENTION

1. Field of the Invention

The present invention relates to electronic packaging and, more particularly, to electronic packaging employing surface mount technology (SMT) wherein passive circuit devices are mounted on the surface of a substrate.

2. Background and Related Art

In the fabrication and assembly of electronic devices on the surface of a substrate, such as a laminate, the process employed typically involves several steps to electrically and mechanically attach the surface mount device (SMD) to the substrate. For example, in the assembly of passive, discrete circuit devices onto a substrate, an adhesive may initially be deposited upon the substrate which adhesive acts to either temporarily or permanently hold the SMD in place. The next step typically involves joining using a solder reflow or dipping process to electrically connect the two terminal SMD to electrical contacts on the substrate. After electrically connecting the SMD to contacts on the substrate, some form of an encapsulant may be used to underfill and/or encapsulate the SMD. Representative of a typical passive device assembly arrangement is that described in U.S. Pat. No. 5,085,364.

One of the difficulties with conventional approaches of this type is that the solder reflow or dipping process typically may leave flux residues in the gap between the SMD and substrate during joining. In addition, further subsequent processing may introduce further contaminants into this gap. Moreover, typical adhesives often do not fully flow into this small gap region. Where the adhesive is cured prior to reflow or dipping, additional contaminants may be introduced during the curing process.

Testing has shown that devices may fail as a result of the above conditions. Failure, at least in part, is due to the fact that the metallurgy of the electrical contact joints can grow dendrites on the surface of the SMD or substrate in the gap region. As a result, the dendrites can electrically short the opposing electrical contacts of the SMD causing device failure. Moreover, the flux residues and contaminants introduced as a result of the process employed may also act to produce device failure. In addition, not only does this multi-step process of forming SMDs on the substrate allow introduction of contaminants and voids, it impacts throughput. Each of the steps involves its own process and parameters. As a result, manufacturing cost is higher than desired and, concomitantly, yield is lower than desired.

Commercially available encapsulants, known as noflow or reflow encapsulants, have been employed in the prior art for attaching flip chips and chip scale packages (CSP's) to a substrate. Such encapsulants typically comprise a single component liquid epoxy-based underfill encapsulant containing flux. Flip chip assembly processing demands for higher I/O, combined with variation in gap heights, have prompted the development of encapsulants that enhance solder joint reliability during temperature cycling of flip chips and CSP's. The use of such encapsulants simplifies the assembly process by combining the soldering and underfilling operations.

Such noflow or reflow encapsulants are designed for the assembly and protection of flip chip-type semiconductor devices. They are also typically designed and developed to be compatible with conventional SMT temperature profiles such that they allow for the conventional solder paste assembly processing of SMDs, similar to those described above, concurrently with the noflow or reflow flip chip assembly. The use of the noflow or reflow underfill material eliminates the long underfill times required by standard capillary underfill for flip chips, and is effective in dealing with their wide range of gap sizes.

SUMMARY OF THE PRESENT INVENTION

In accordance with the present invention, a structural arrangement and assembly process is provided for discrete, passive SMD's using commercially available noflow or reflow liquid resin encapsulants containing a flux material. The use of the terms "noflow" and "reflow", as used herein, are synonymous. For simplicity, the tern "noflow" will generally be used hereinafter. The noflow encapsulant is deposited on a substrate between presoldered pads in appropriate volume so that with appropriately applied heat it provides a good wetting contact between the SMD electrical contacts and the presoldered pads, and is also sufficient to effectively fill the gap between SMD and substrate and encapsulate the bonded connections.

Typically, discrete, passive SMD's are two or more terminal devices to be electrically connected between a set of contact pads on the substrate. The SMD, in accordance with the present invention, is placed into the noflow encapsulant on the substrate until the SMD electrical contacts make contact with the respective presoldered contacts or pads on the substrate. The assembly is then placed in a reflow oven to activate the flux material, reflow the solder and cure the noflow encapsulant, in accordance with a specified reflow time/temperature profile.

It is, therefore, an object of the present invention to provide an improved SMD structural arrangement on a substrate and process for fabricating same.

It is a further object of the present invention to provide a more reliable passive SMD as assembled on a substrate.

It is yet a further object of the present invention to simplify the process for assembling passive SMD's onto a substrate.

It is yet still a further object of the present invention to reduce manufacturing cost and increase yield in the assembly of passive SMD's onto a substrate therefore.

These foregoing and other objects, features and advantages of the invention will be apparent from the following more particular description of a preferred embodiment of the invention, as illustrated in the accompanying drawings, wherein like reference members represent like parts of the invention

DETAILED DESCRIPTION

Figure 1A:
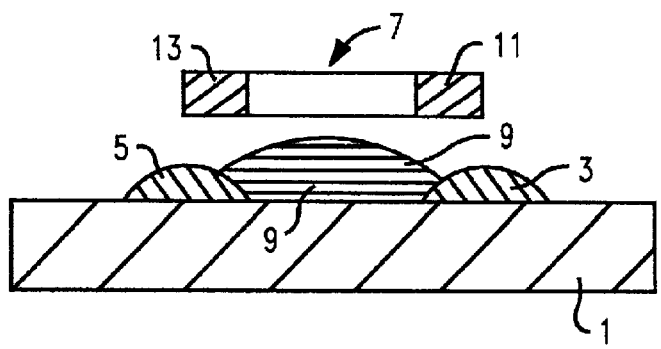
FIGS. 1a–d show the steps employed to assemble a SMD onto a substrate, in accordance with the present invention.

With reference to FIGS. 1a–d, there is shown the manner in which the initial steps of the SMD assembly process, in accordance with the present invention, are carried out. The SMD may be any of a variety of discrete, passive devices, such as a capacitor, diode, resistor, inductor, etc. Typically, such devices would be two terminal devices, but can have more than two terminals. In the arrangement of FIG. 1a, a capacitor structure, such as a dog bone capacitor structure, is illustratively described. Although the process described may be employed for any discrete, passive SMD, it is particularly effective in overcoming the dendrite shorting problem of capacitor devices described above.

Figure 1B:
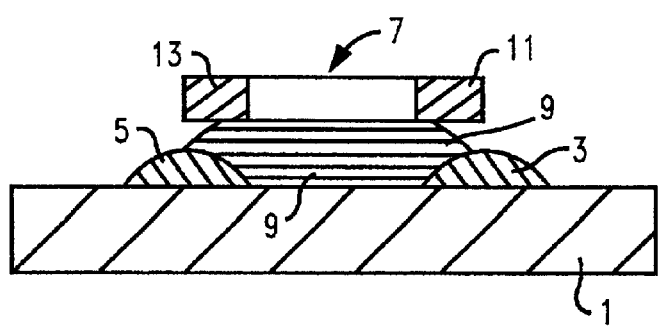
Figure 1C:
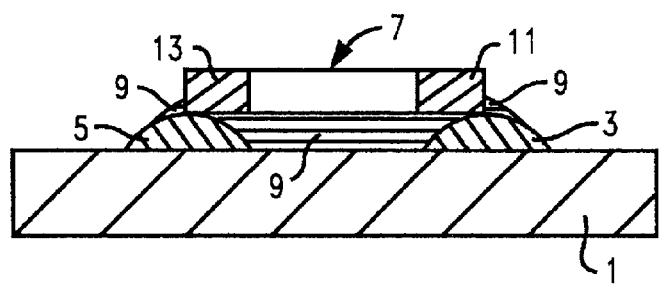

With reference to FIG. 1a, there is shown a substrate 1, such as a conventional laminate substrate, as used, for example, in flip chip plastic ball grid array (FC/PBGA) packages. However, it should be understood that substrate 1 may be any of a variety of conventional substrate materials. Solder pads 3 and 5 are presoldered to circuit contacts (not shown) on substrate 1. As shown, the pads may be preformed in generally a mound-like shape. The solder may, for example, be a eutectic composed of 63% Sn/37% Pb. However, other solder compositions may be employed. Capacitor 7 is shown above the substrate ready for positioning thereon. Before positioning capacitor 7 onto substrate 1, a liquid resin noflow underfill material 9 is dispensed onto substrate 1, between and in contact with solder pads 3 and 5. The resin may be a filled or unfilled resin. Typically the noflow material is dispensed as a mound to cover the highest point, or about one half or slightly more than one half, of the solder pads, as shown in FIG. 1b. The main consideration is that there is sufficient underfill to cover the peak of the solder pads when capacitor 7 is fully pressed into place, as shown in FIG. 1c. However, other forms of noflow underfill application are possible as long as the underfill completely fills the region between pads 3 and 5 without voids extending from one pad to the other, and is spread in a sufficiently thick layer so as to extend to cover the peaks or highest points of pads 3 and 5.

The dispensing step may be carried out using fluid dispenser, pin transfer, fluid jetting or other application methods. The dispensed noflow material may be, for example, Kester Se-Cure 9101 reflow encapsulant. However, other commercially available reflow materials, such as Dexter Hysol FF 2000 or 2200, Emerson & Cuming Amicon E1350, Alpha Metals Staychip NUF-DP0071 underfill encapsulants, may also be used. Other suppliers, such as Shin Etsu, Namics, Ablestik, and 3M make similar products. These liquid noflow or reflow encapsulants all provide a flux for eutectic solder formation and a resin so as to form an epoxy-based underfill encapsulant with flux combined into a one part epoxy system. All are particularly developed and designed for flip-chip applications.

As shown in FIG. 1b, capacitor 7 is aligned and positioned onto noflow encapsulant material 9 and then pressed into the encapsulant so that capacitor bars or electrical contacts 11 and 13 make mechanical contact with solder pads 3 and 5, as shown in FIG. 1c. As can be seen, the capacitor bars or contacts have more than one surface to which electrical contact may be made. It is only necessary at this point, however, that the lower contact surface of the capacitor make contact with the solder pads and such contact does not have to be complete. For example, a thin layer of resin may be present between the capacitor contacts and solder pads which resin will automatically be displaced during heating in the oven as the resin drops in viscosity.

Figure 4:
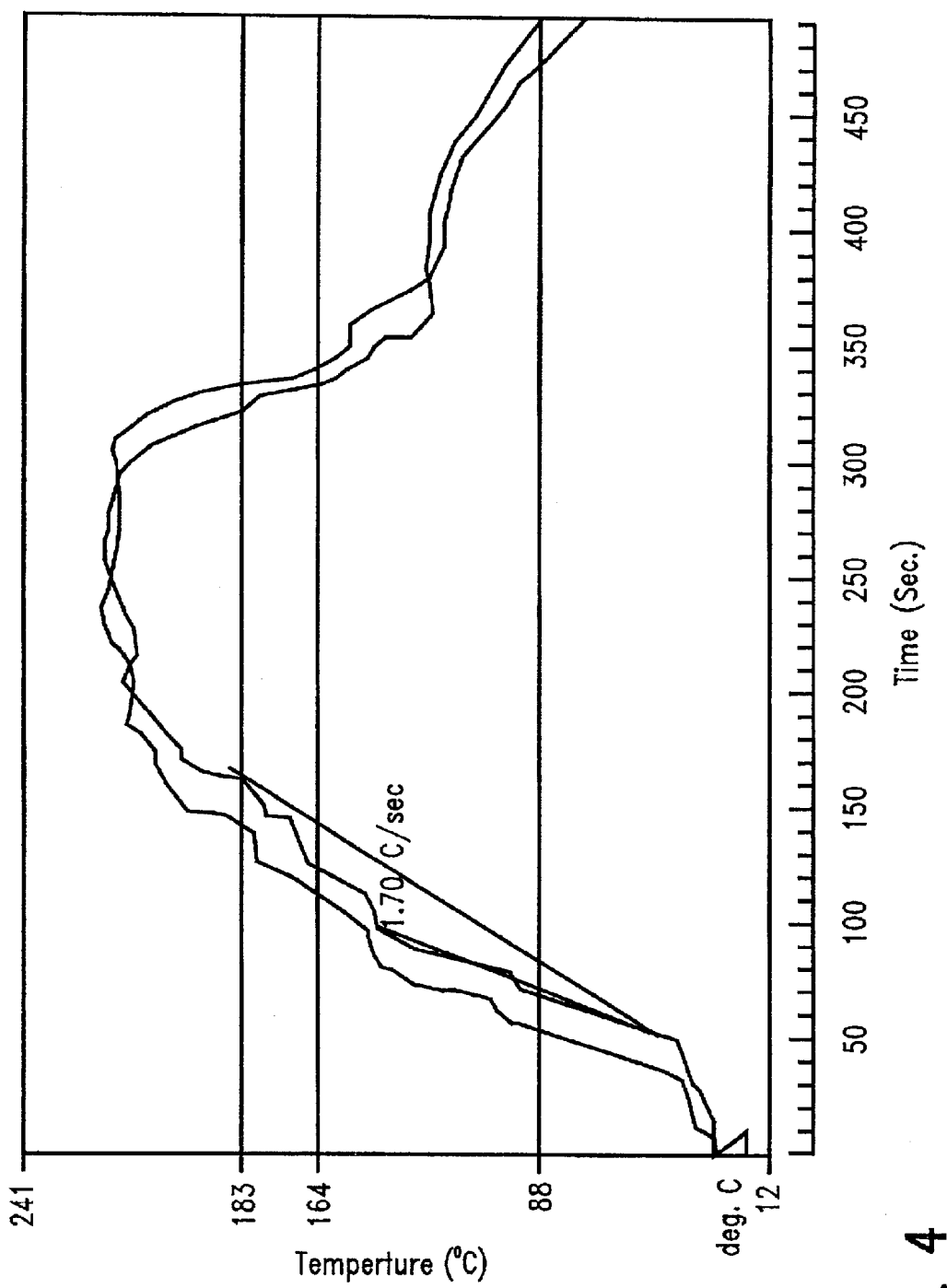
FIG. 4 shows a drawing representing the general plot of time-temperature profiles used in the reflow process of the assembly depicted in FIGS. 1a–d.

The assembly of FIG. 1c is then placed into an oven and heated. Generally, the oven is heated at a rate of no more than about 2° C./sec. or less than about 1.4° C./sec. up to a peak temperature of no more than about 230° C. This ramp rate is fairly steady up to the melting point of the solder which, for 63% Sn/37% Pb, is 183° C. A temperature in excess of 183° C. is then held for at least about 180 sec. (dwell time). FIG. 4 shows this general profile for several runs of different SMD's wherein a peak ramp rate of approximately 1.70° C./sec and a dwell time of about 180–190 sec. is shown In this regard, it has been found that such a ramp rate leading to a dwell time of at least about 180 sec. typically works well to provide good solder wetting in regard to other elements being reflowed with the SMD, and acts to provide both good solder reflow and bonding, and good underfill flow, curing and encapsulation, for the SMD itself.

Figure 1D:
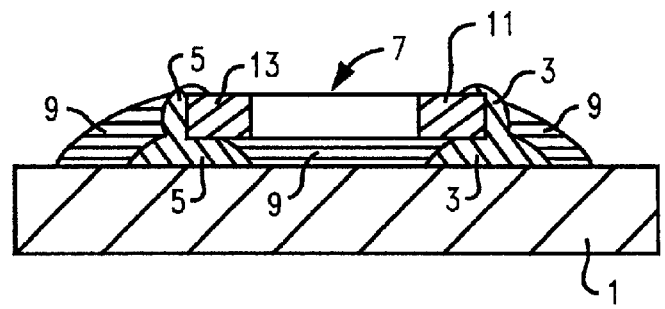

The temperature ramp up to about 183° C. generally encompasses the fluxing phase wherein the active ingredients in the noflow encapsulant act to prepare the metallic surfaces to wet. In this regard, the metallic contacts 11 and 13 of capacitor 7 may, for example, be made of tin. Then, during the dwell period the solder reflows and bonds to the metal capacitor contacts and the metal contacts on the substrate. At the same time, the noflow material completes a cross linking process to become a solid encapsulant. As stated above, a dwell time of at least about 180 sec. acts to provide good bonding and effective encapsulation and curing. However, depending upon the application, a higher dwell time may be employed. A post curing period at temperatures of around 150 degrees C. for a period of about 1 to 2 hours may also be employed in the curing process. Thus, encapsulation and bonding of the SMD is carried out in a single process which process simultaneously protects the site from the incursion of contaminants during processing and ultimately provides a permanent barrier to subsequent dendrite growth and breakdown The result of this process is shown in FIG. 1d. As can be seen, solder pads 3 and 5 of FIG. 1c have been reflowed and formed around contacts 11 and 13 so as to form a uniform bond thereto. Similarly, resin encapsulant 9 became sufficiently viscous so that excess encapsulant spills out and flows around the reflowed solder on the capacitor contacts to form, by surface tension and the like, fillets thereon to thereby encapsulate the solder connections while at the same time filling and encapsulating the gap or space between the surface of substrate 1 and capacitor 7 in the region between solder connections 3 and 5.

Figure 2:
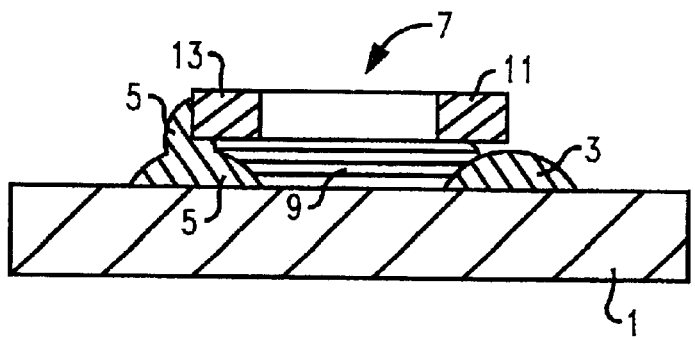
FIG. 2 shows the result of using insufficient noflow encapsulant in the assembly steps depicted by FIGS. 1a–d.

FIG. 2 depicts the effect of insufficient noflow encapsulant dispensing between solder pads on substrate 1. By failing to provide an amount of noflow encapsulant sufficient to spread out and cover the peaks of the solder pads when the SMD is pressed into contact with the pads, non-wetting or partial wetting occurs causing little or no bonding between, for example, contact 11 and solder pad 3, as shown. As mentioned above, dispensing the encapsulant between the solder pads in a mound so that the mound covers about one half of each pad has been found sufficient to provide good wetting at each SMD contact. With such an arrangement, the top of the mound would typically extend above the peaks of the solder pads.

Figure 3A:
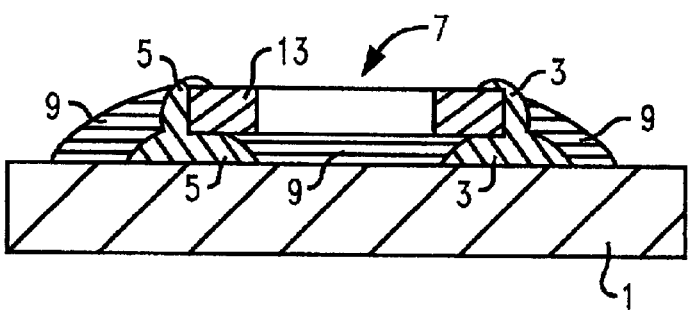
FIGS. 3a–b show the result of using too much noflow encapsulant in the assembly steps depicted by FIGS. 1a–d.
Figure 3B:
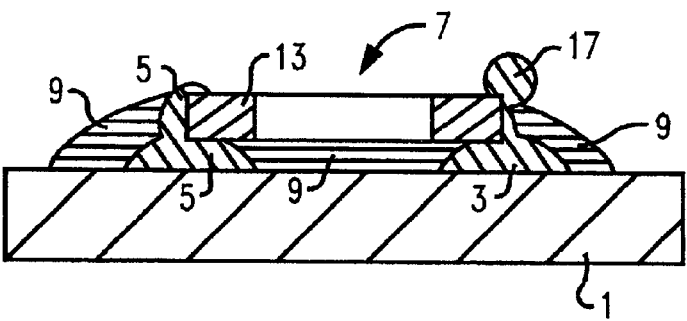

In contrast to the condition depicted in FIG. 2, FIGS. 3a–b depict the condition wherein an excessive amount of noflow encapsulant is dispensed between the solder pads on substrate 1. FIG. 3a depicts conditions after the solder wetting and joining of the capacitor contacts 11 and 13 and the curing of encapsulant 9. FIG. 3b depicts conditions after subsequent solder reflow(s) wherein a nodule or protrusion 17 is created between contact 11 and the encapsulant. This nodule or protrusion is the result of solder volume expansion during the subsequent reflow(s) wherein this expansion creates enough pressure to break through weak spots or openings in the encapsulant. The excessive noflow encapsulant creates a rigid barrier which acts to sufficiently constrain the subsequent solder expansion such as to cause the break-through in the encapsulant in weak spots or cause the solder to flow out through openings or pin holes where there is no encapsulant. It has been found that an excessive noflow encapsulant condition begins to exist when the amount of mounded encapsulant dispensed between the solder pads extends much beyond the midpoint or peak of the pads.

It should be understood that solder compositions, other tan eutectics, may as well be employed. For example, lead free solder compositions or tin/lead/silver solder compositions may be used. It is clear, however, that when higher melting point solders are used, then higher curing temperature encapsulants may be required.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of fabricating an electronic assembly, comprising:

forming a mound of solder on each of at least a pair of electrical contacts on a substrate so as to form at least a pair of solder mounds;

applying a noflow resin encapsulant containing a flux material between said at least a pair of solder mounds so that said encapsulant partially covers said solder mounds;

pressing a passive SMD having at least a pair of electrical contacts into said resin encapsulant so that the said at least a pair of electrical contacts of said passive SMD respectively make contact with the said at least a pair of solder mounds; and applying heat to said substrate and passive SMD so that initially said flux material is activated to prepare said electrical contacts for solder wetting and then said solder mounds melt and reflow to bond said electrical contacts and said resin encapsulant is cured.

2. The method as set forth in claim 1 wherein said step of applying heat comprises applying heat at a ramp rate between about 1.4° C./sec. and about 2° C./sec. up to the melting point of said solder mounds and then maintaining a temperature above the said melting point of said solder mounds for more than 90 sec.

3. The method as set forth in claim 2 wherein said temperature is maintained above the said melting point of said solder mounds for at least 180 sec.

4. The method as set forth in claim 2 wherein said melting point is about 183° C.

5. The method as set forth in claim 4 wherein said ramp rate is about 1.70° C./sec.

6. The method as set forth in claim 5 wherein the temperature maintained above the said melting point of said solder mounds peaks at about 230° C.

7. The method as set forth in claim 6 wherein said step of dispensing noflow resin encapsulant between said solder mounds comprises dispensing an amount so as to form a mound of encapsulant to cover the highest point of each of said solder mounds.

8. The method as set forth in claim 7 wherein passive SMD is a capacitor device.

9. The method as set forth in claim 8 wherein said substrate is a laminate.

10. The method as set forth in claim 9 wherein said solder mounds comprise 63% Sn/37% Pb.

11. A method of assembling an SMD on a substrate, comprising:

forming a solder mound on each of at least a pair of electrical contacts on a substrate so as to form at least a pair of solder mounds;

dispensing a noflow liquid encapsulant including both flux material and resin underfill encapsulant onto said substrate in the space between said at least a pair of solder mounds in sufficient quantity so as to form a mound of encapsulant which partially covers said solder mounds;

pressing a passive SMD having at least a pair of electrical contacts into said mound of encapsulant so that respective ones of said at least a pair of electrical contacts of said passive SMD made contact with said at least a pair of solder mounds;

applying heat to said substrate and passive SMD so that said flux material is initially activated to prepare said electrical contacts for solder wetting; and applying further heat to said substrate and passive SMD to melt and reflow said solder bumps so as to bond to said contacts and cause said resin encapsulant to form solid fillets around said SMD contacts and reflowed solder and fill the space between said SMD and substrate.

12. The method as set forth in claim 11 wherein said steps of applying heat comprise applying heat at a ramp rate of between about 1.4° C./sec. and about 2° C./sec. up to the melting point of said solder mounds and then maintaining a temperature above the said melting point of said solder mounds for more than 90 sec.

13. The method as set forth in claim 12 wherein said temperature is maintained above the said melting point of said solder mounds for at least 180 sec.

14. The method as set forth in claim 12 wherein said melting point is about 183° C.

15. The method as set forth in claim 14 wherein said ramp rate is about 1.70° C./sec.

16. The method as set forth in claim 12 wherein steps of dispensing said noflow liquid encapsulant to form a mound of encapsulant comprises dispensing said encapsulant in a quantity to form a mound higher than said solder mounds so as to cover at least a half of each of said solder mounds.

17. The method as set forth in claim 13 wherein said SMD is a capacitor device.

* * * * *